United States Patent [19]

Shen et al.

[11] Patent Number: 5,659,180

[45] Date of Patent: Aug. 19, 1997

[54] HETEROJUNCTION INTERBAND TUNNEL DIODES WITH IMPROVED P/V CURRENT RATIOS

[75] Inventors: Jun Shen; Raymond K. Tsui, both of Phoenix; Saied N. Tehrani, Scottsdale; Herb Goronkin, Tempe, all of Ariz.

[73] Assignee: Motorola, Schaumburg, Ill.

[21] Appl. No.: 556,686

[22] Filed: Nov. 13, 1995

[51] Int. Cl.⁶ .................................................. H01L 29/06
[52] U.S. Cl. ............................. 257/25; 257/22; 257/23; 257/18
[58] Field of Search .................... 257/14, 18, 22, 257/23, 25, 12, 201

[56] References Cited

U.S. PATENT DOCUMENTS

5,061,970  10/1991  Goronkin ............................ 257/22
5,296,721  3/1994  Schulman et al. ................... 257/25
5,489,785  2/1996  Tehrani et al. ..................... 257/23

*Primary Examiner*—Minh-Loan Tran
*Attorney, Agent, or Firm*—Eugene A. Parsons

[57] ABSTRACT

A heterojunction tunnel diode with first and second barrier layers, the first barrier layer including aluminum antimonide arsenide. A quantum well formation is sandwiched between the first and second barrier layers, and includes first and second quantum well layers with a barrier layer sandwiched therebetween, the first quantum well layer being adjacent the first barrier layer. The first quantum well layer is gallium antimonide arsenide which produces a peak in hole accumulations therein. The second quantum well layer produces a peak in electron accumulations therein. A monolayer of gallium antimonide is sandwiched in the first quantum well layer at the peak in hole accumulations and a monolayer of indium arsenide is sandwiched in the second quantum well layer at the peak in electron accumulations.

33 Claims, 5 Drawing Sheets

FIG. 6 ined in an article entitled "P-N Double Quantum Well Resonant Interband Tunneling Diode With Peak-to-Valley Current Ratio of 144 at Room Temperature", by H.H. Tsai et al., *IEEE Electron Device Letters*, Vol. 15, No. 9, September 1994.
HETEROJUNCTION INTERBAND TUNNEL DIODES WITH IMPROVED P/V CURRENT RATIOS

FIELD OF THE INVENTION

The present invention pertains to heterojunction tunnel diodes and more specifically to heterojunction tunnel diodes with improved peak-to-valley current ratio.

BACKGROUND OF THE INVENTION

Generally, the most important figure of merit in heterojunction tunneling diodes is the peak-to-valley (P/V) current ratio. This ratio needs to be as high as possible. To date, the highest P/V current ratio at room temperature is 144, obtained in an $In_{.52}Al_{.48}As/In_{.53}Ga_{.47}As$ double quantum well, Esaki tunneling diode. This diode is disclosed in an article entitled "P-N Double Quantum Well Resonant Interband Tunneling Diode With Peak-to-Valley Current Ratio of 144 at Room Temperature", by H.H. Tsai et al., *IEEE Electron Device Letters*, Vol. 15, No. 9, September 1994. The mechanism for the improved P/V current ratio was proposed by M. Sweeny and J. M. Xu in Applied Physics Letter, 54, 546 (1989) and is disclosed in an abstract entitled "Demonstration of a DQW Resonant Tunneling Diode with a 300K Peak-to-Valley Ratio over 100", *Abstracts of the 1992 International Conference on Solid State Devices and Materials, Tsukuba*, 1992, pp.711–712.

In the above described double quantum well device the improvement is claimed to be the coincidence of the resonance condition between the quantized states and the interband tunneling condition in Esaki diodes. Although the coincidence of the two conditions should in principle give enhanced peak tunneling current, there are no qualitative estimates in the disclosure about the magnitude of the current. In documented experiments attempting to prove this theory, some important parameters were left out, making the conclusions uncertain.

It would be highly desirable to provide heterojunction tunnel diodes with high P/V current ratios.

Accordingly, it is a purpose of the present invention to provide new and improved heterojunction tunnel diodes with improved P/V current ratios.

It is another purpose of the present invention to provide new and improved heterojunction tunnel diodes with improved P/V current ratios in which the materials utilized substantially enhance the peak current.

It is a further purpose of the present invention to provide new and improved heterojunction tunnel diodes with improved P/V current ratios in which the materials utilized reduce the valley current.

SUMMARY OF THE INVENTION

The above problems and others are substantially solved and the above purposes and others are realized in an embodiment of a heterojunction tunnel diode with improved peak-to-valley current ratio including a first barrier layer with a first type of doping and a second barrier layer with a second type of doping opposite the first type of doping, a quantum well formation including first and second quantum well layers with a barrier layer sandwiched therebetween, the quantum well formation being sandwiched between the first and second barrier layers with the first quantum well layer being positioned adjacent the first barrier layer and the second quantum well layer being positioned adjacent the second barrier layer, and the first quantum well layer including gallium antimonide arsenide.

The above problems and others are substantially solved and the above purposes and others are further realized in another embodiment of a heterojunction tunnel diode with improved peak-to-valley current ratio wherein the first barrier layer includes aluminum antimonide arsenide.

The above problems and others are substantially solved and the above purposes and others are further realized in another embodiment of a heterojunction tunnel diode with improved peak-to-valley current ratio wherein the first quantum well layer produces a peak in hole accumulations, which peak is generally situated within the first quantum well layer, the second quantum well layer produces a peak in electron accumulations, which peak is generally situated within the second quantum well layer, and the quantum well formation further includes a monolayer of gallium antimonide sandwiched in the first quantum well layer generally at the peak in hole accumulations and a monolayer of indium arsenide sandwiched in the second quantum well layer generally at the peak in electron accumulations.

BRIEF DESCRIPTION OF THE DRAWINGS

Referring to the drawings.

DESCRIPTION OF THE PREFERRED EMBODIMENTS

Figure 1:
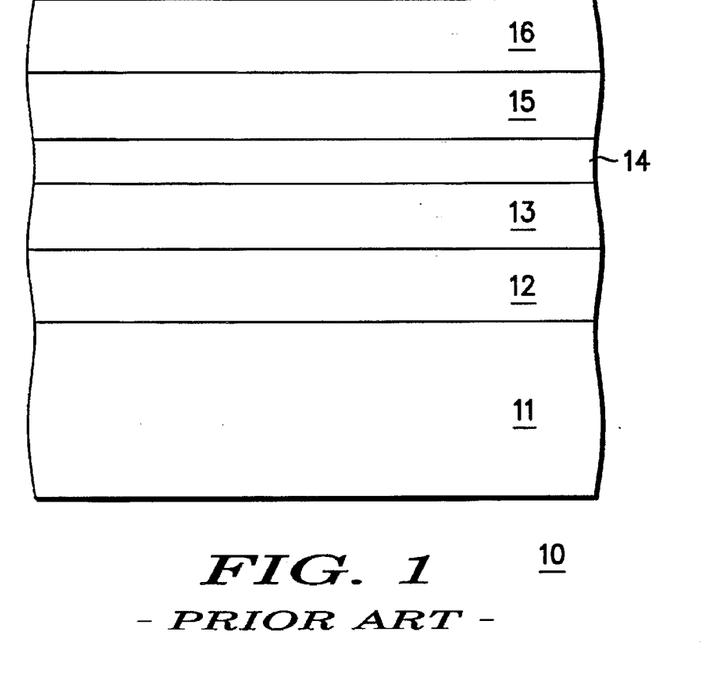
FIG. 1 is a simplified cross-sectional view of a prior art heterojunction tunnel diode.

Referring specifically to FIG. 1, a simplified cross-sectional view of a prior art double quantum well heterojunction tunnel diode 10 is illustrated. Diode 10 includes an indium phosphide (InP) substrate 11 with a first barrier layer 12 of indium aluminum arsenide (InAlAs) epitaxially grown thereon. As is known in the art, layer 12 is crystalographically matched to substrate 11 and forms a continuous crystalline structure. Also, barrier layer 12 is doped with a n-type dopant material to provide n-type conduction.

A first quantum well layer 13 of indium gallium arsenide (InGaAs) is epitaxially grown on the surface of barrier layer 12, a barrier layer 14 of indium aluminum arsenide (InAlAs) is grown on first quantum well layer 13, and a second quantum well layer 15 of indium gallium arsenide (InGaAs) is epitaxially grown on the surface of barrier layer 14. Layers 13, 14 and 15 are crystalographically matched to each other and to the supporting structure in a well known manner.

A final barrier layer 16 is epitaxially grown on the surface of second quantum well layer 15 and is doped with a p-type dopant material to provide p-type conduction. An electrical contact is provided between the upper surface of barrier layer 16 and the lower surface of barrier layer 12 (or the lower surface of substrate 11) in some convenient fashion, to complete diode 10. This structure is the double quantum well, heterojunction tunnel diode discussed in the above identified published articles.

Figure 2:
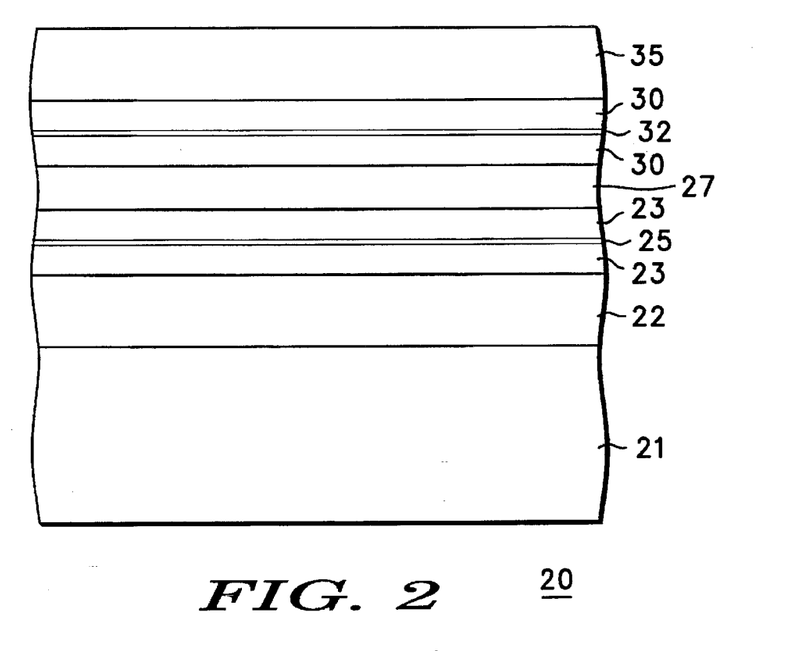
FIG. 2 is a simplified cross-sectional view of a heterojunction tunnel diode with improved peak-to-valley current ratio generally in accordance with the present invention.

Referring now to FIG. 2, a simplified cross-sectional view of a double quantum well, heterojunction tunnel diode 20 with improved peak-to-valley current ratio is illustrated, which diode 20 is generally in accordance with the present invention. Diode 20 includes an indium phosphide (InP) substrate 21 with a first barrier layer 22 of aluminum antimonide arsenide (AlSbAs) epitaxially grown thereon. Layer 22 is crystallographically matched to substrate 21 and forms a continuous crystalline structure. Also, barrier layer 22 is doped with a p-type dopant material to provide p-type conduction.

A first quantum well layer 23 of gallium antimonide arsenide (GaSbAs) is epitaxially grown on the surface of barrier layer 22. A monolayer 25 of gallium antimonide (GaSb) is sandwiched in first quantum well layer 23 by epitaxially growing a first portion of first quantum well layer 23, growing monolayer 25 on the first portion, and then growing the remainder of first quantum well layer 23 on monolayer 25. Generally, quantum well layer 23 has a thickness in the range of 20–60 angstroms, and it has been found that a quantum well width of approximately 40 angstroms provides the largest overlap or carrier concentration. The exact position of monolayer 25 within first quantum well layer 23 will be explained in more detail presently.

A barrier layer 27 of indium aluminum arsenide (InAlAs) is grown on first quantum well layer 23, and a second quantum well layer 30 of indium gallium arsenide (InGaAs) is epitaxially grown on the surface of barrier layer 27. A monolayer 32 of indium arsenide (InAs) is sandwiched in second quantum well layer 30 by epitaxially growing a first portion of second quantum well layer 30, growing monolayer 32 on the first portion, and then growing the remainder of second quantum well layer 30 on monolayer 32. Generally, quantum well layer 30 has a thickness in the range of 20–60 angstroms, and it has been found that a quantum well width of approximately 40 angstroms provides the largest overlap or carrier concentration. The exact position of monolayer 32 within second quantum well layer 30 will be explained in more detail presently. Layers 23, 27 and 30 are crystalographically matched to each other and to the supporting structure, including barrier layer 22 in a well known manner. Monolayers 25 and 32 are under lattice strain but they do not generate lattice defects (dislocations) because their thicknesses are below a critical thickness.

A final barrier layer 35 of InAlAs is epitaxially grown on the surface of second quantum well layer 30. An electrical contact (not shown) is provided between the upper surface of barrier layer 35 and the lower surface of barrier layer 22 (or the lower surface of substrate 21) in some convenient fashion, to complete diode 20. The various improvements in diode 20 resulting in the improved P/V current ratio will now be explained in detail.

Figure 3:
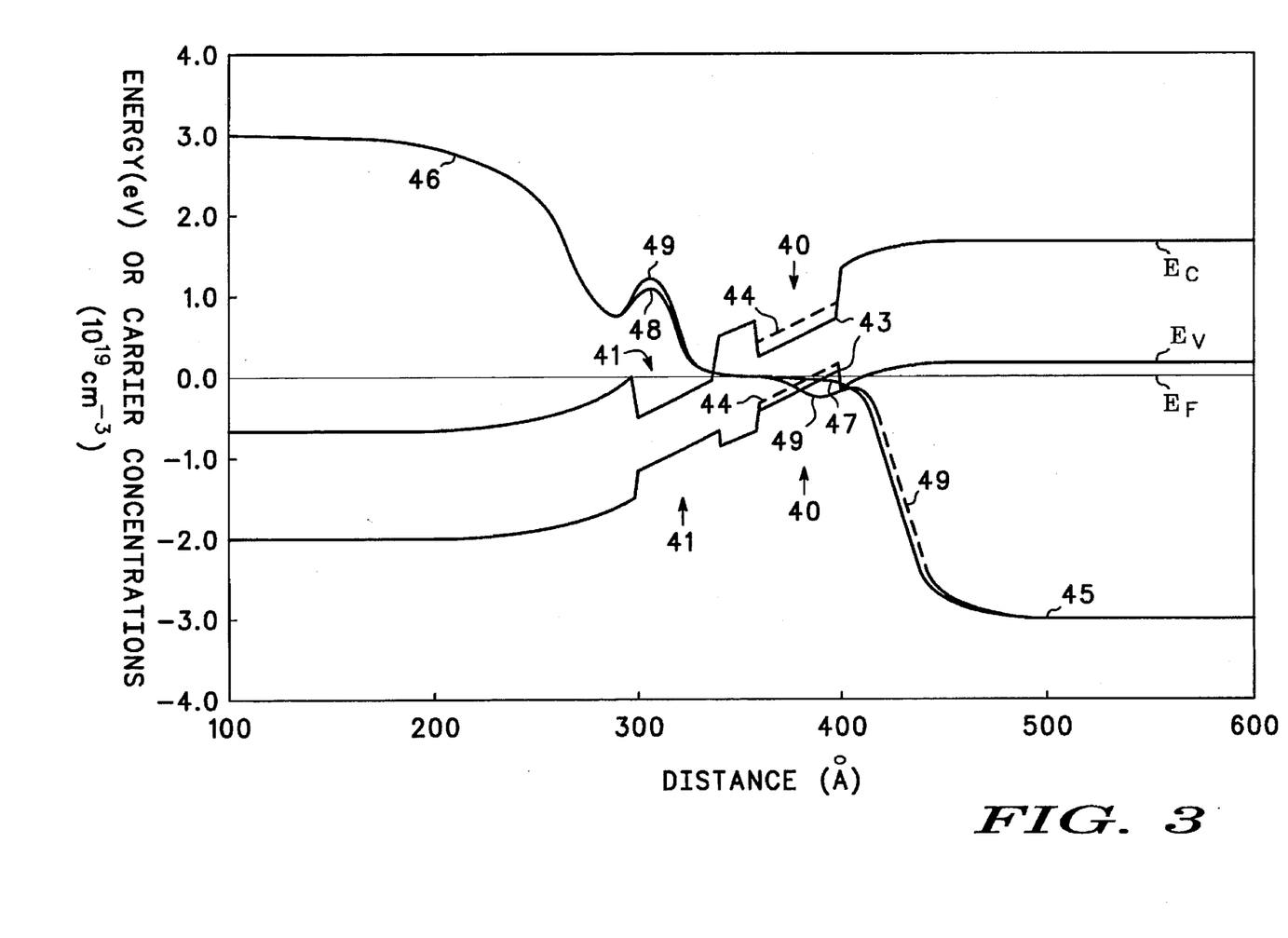
FIGS. 3, 4 and 5 are energy and/or carrier concentration for various portions, or different embodiments, of the heterojunction tunnel diode illustrated in FIG. 2.

Referring specifically to FIG. 3, an energy and/or carrier concentration diagram illustrating the effect of first quantum well layer 23 in heterojunction tunnel diode 20, illustrated in FIG. 2. The diagram of FIG. 3 illustrates conduction band energy ($E_c$) and valence band energy ($E_v$) (in a typical band diagram), wherein the vertical axis represents relative energy in electron volts, and the horizontal axis represents thickness or depth within the device structure shown in FIG. 2. The Fermi level, designated $E_F$, is also included for the structure. The left hand side of the drawing is the upper surface of barrier. layer 35, while the right hand side of the drawing is barrier layer 22, with substrate 21 not included to simplify the drawings.

Conduction, or current flow through diode 20 is produced by a combination of resonant current flow and Esaki tunneling. Resonant current flow is produced by alignment of quantized energy levels in the quantum well layers 23 and 30, when a bias is applied across diode 20, in a well known manner and will not be explained further herein. Esaki tunneling is the phenomenon of primary interest in this disclosure and several disclosed features which enhance the current due to tunneling are a direct result of the following findings. A first curve 45 in FIG. 3 represents a concentration of holes in barrier layer 22 and quantum well layer 23 (the p-region), with the concentration starting at some number (e.g. $3 \times 10^{19}$ cm$^{-3}$) and progressing toward zero as barrier layer 27 is approached. A second curve 46 in FIG. 3 represents a concentration of electrons in barrier layer 35 and quantum well layer 30, with the concentration starting at some number (e.g. $3 \times 10^{19}$ cm$^{-3}$) and progressing toward zero as barrier layer 27 is approached. It has been determined that tunneling current is proportional to the amount of overlap of the concentration of electrons and holes. In simple terms, tunneling current is a function of the closeness of available hole and electron distributions at the p-n junction. The shorter the electron-hole separation means the more available electrons and holes for tunneling at a smaller distance.

A first or P-side quantum well 40 and a second or N-side quantum well 41 each have predetermined valence band energy $E_v$, and conduction band energy $E_c$, which energy is determined by the material used to form first quantum well layer 23 and second quantum well layer 30, respectively. Assuming that quantum well layer 23 is formed of indium gallium arsenide (InGaAs), for example, valence and conduction band energies for P-side quantum well 40, are illustrated in FIG. 3 and designated 43. In the embodiment illustrated in FIG. 2, however, quantum well layer 23 is formed of gallium antimonide arsenide (GaSbAs) and the valence and conduction band energies are illustrated in FIG. 3 and designated 44.

Solid curves 45 and 46 represent results of the structure with both quantum well layers 23 and 30 being formed of indium gallium arsenide (InGaAs), as in the prior art. Also, it should be noted that quantum well 40 produces a peak 47 in curve 45 and quantum well 41 produces a peak 48 in curve 46. Peak 47 occurs physically within quantum well layer 23 and peak 48 occurs physically within quantum well layer 30. The effect of changing the material of quantum well layer 23 to gallium antimonide arsenide (GaSbAs) is represented by a dashed curve 49 partially overlying curves 45 and 46. While virtually any GaSbAs will provide improved results, the general equation GaSb$_x$As$_{1-x}$ is preferred and the material which was found to provide the best results while maintaining the required crystallographic matching was GaSb$_{.48}$As$_{.52}$. Since gallium antimonide arsenide has a higher valence-band edge than indium gallium arsenide, the hole accumulation in p-quantum well 40 is increased and so is the electron-hole overlap. As can be seen by following dashed curve 49, the electron distribution represented by curve 46 is effected only slightly (increased in N-side quantum well 41), but the hole concentration, represented by curve 45 and peak 47, is increased significantly. This increase in overlap, or hole concentration at the junction, significantly increases the peak tunneling current.

Figure 4:
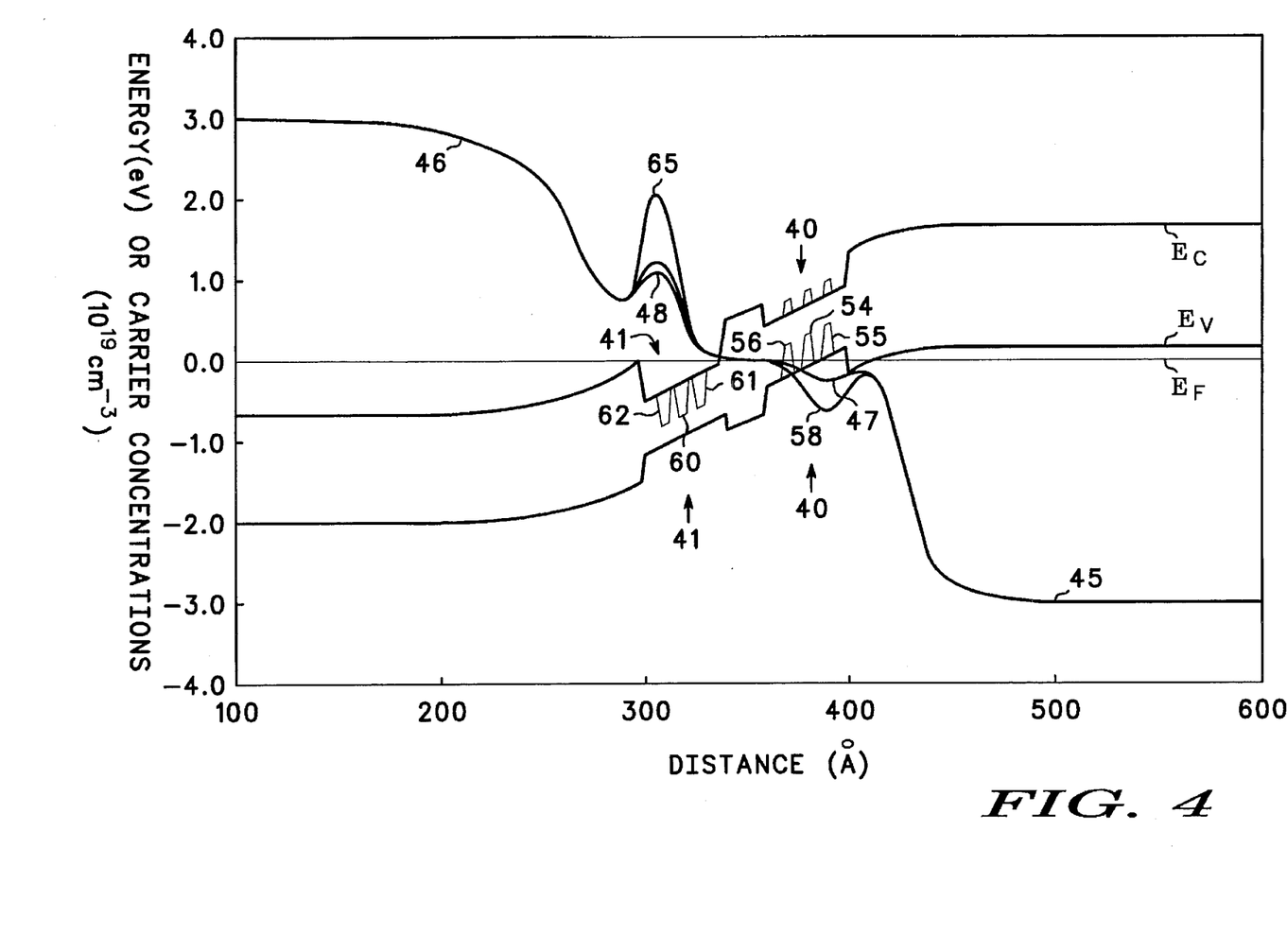

Referring to FIG. 4, an energy and/or carrier concentration diagram illustrates the effect of monolayers 25 and 32 in heterojunction tunnel diode 20, illustrated in FIG. 2. Various components of the diagram of FIG. 4 which coincide with components of the diagram of FIG. 3 and which were explained above, are designated with the same numerals. During experimentation with monolayer 25, a single monolayer of material having a valence band higher than the valence band of quantum well layer 23 was positioned at several different locations within quantum well layer 23 (on several different devices), as illustrated generally by dips 54, 55, and 56 in quantum well 40. It was found that monolayer 25 generally increases peak 47 in most positions, but is most effective when monolayer 25 is positioned substantially at peak 47, which is represented by dip 55 and extended peak 58. Also, a single monolayer of material having a conduction band lower than the conduction band of quantum well layer 30 was positioned at several different locations within quantum well layer 30 (on several different devices), as illustrated generally by dips 60, 61, and 62 in quantum well 41. Again, it was found that monolayer 32 generally increases peak 48 in most positions, but is most effective when monolayer 32 is positioned substantially at peak 48, which is represented by dip 62 and extended peak 65.

It will be understood by those skilled in the art that a single monolayer of a specific material in either or both quantum wells 40 and 41 substantially increases the peak current of diode 20 and that additional monolayers (e.g. side-by-side or spaced apart) may be included to alter the depth of quantum wells 40 and 41 at various points (e.g. 54–56, 60–62) and further enhance the peak current. Also, while gallium antimonide and indium arsenide are utilized in the specific embodiment explained herein, it should be understood that other materials which can be crystalographically matched without generating dislocations during the growing processes and which generally have a valence/conduction band higher/lower than the materials forming quantum wells 40 and 41 can be utilized.

Figure 5:
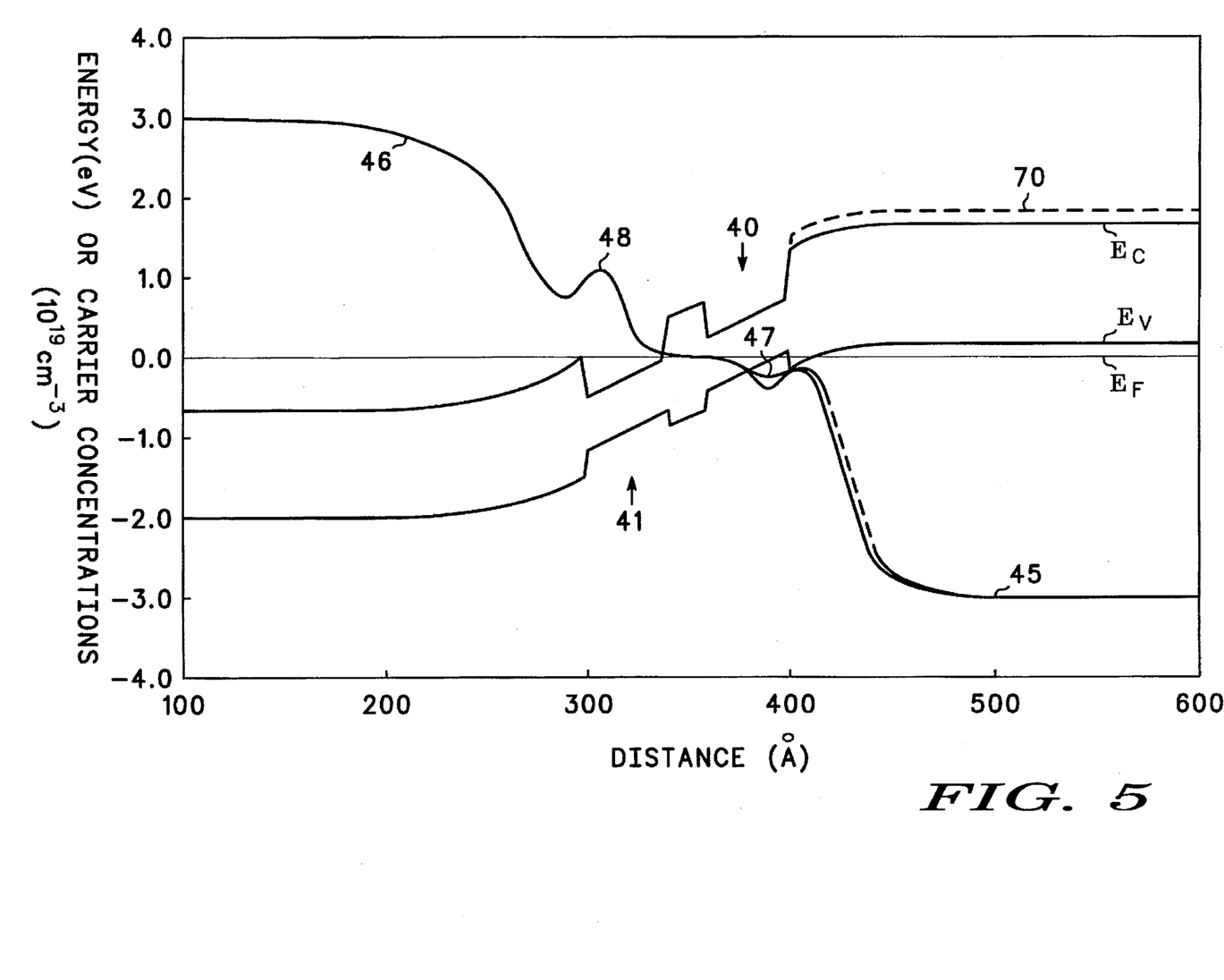

Referring specifically to FIG. 5, an energy and/or carrier concentration diagram illustrates the effect of barrier layer 35 in heterojunction tunnel diode 20, illustrated in FIG. 2. Various components of the diagram of FIG. 5 which coincide with components of the diagram of FIG. 3 and which were explained above, are designated with the same numerals.

Solid curves 45 and 46 represent the hole/electron accumulation in diode 20 with barrier layer 22 being formed of indium aluminum arsenide (InAlAs), as in the prior art. Also, the curve $E_C$ represents the conduction band of the materials of diode 20. Also, as previously explained, quantum well 40 produces a peak 47 in curve 45 and quantum well 41 produces a peak 48 in curve 46. The effect of changing the material of barrier layer 22 to aluminum antimonide arsenide (AlSbAs) is represented by a dashed curve 70 positioned generally above curve $E_c$. While virtually any AlSbAs will provide improved results, the general equation $AlSb_xAs_{1-x}$ is preferred and the material which was found to provide the best results while maintaining the required crystallographic matching was $AlSb_{.57}As_{.43}$. As can be seen, peak 47 in hole distribution curve 45 is increased in P-side quantum well 40, which means that the hole concentration is increased. Also, the barrier height of the conduction band on the p-side (barrier 22 side) of quantum well 40 is increased, which increases the electron blocking. This increase in overlap, or hole concentration at the junction, and increased electron blocking increases the peak tunneling current while reducing the valley current (i.e. the amount of leakage current).

Figure 6:
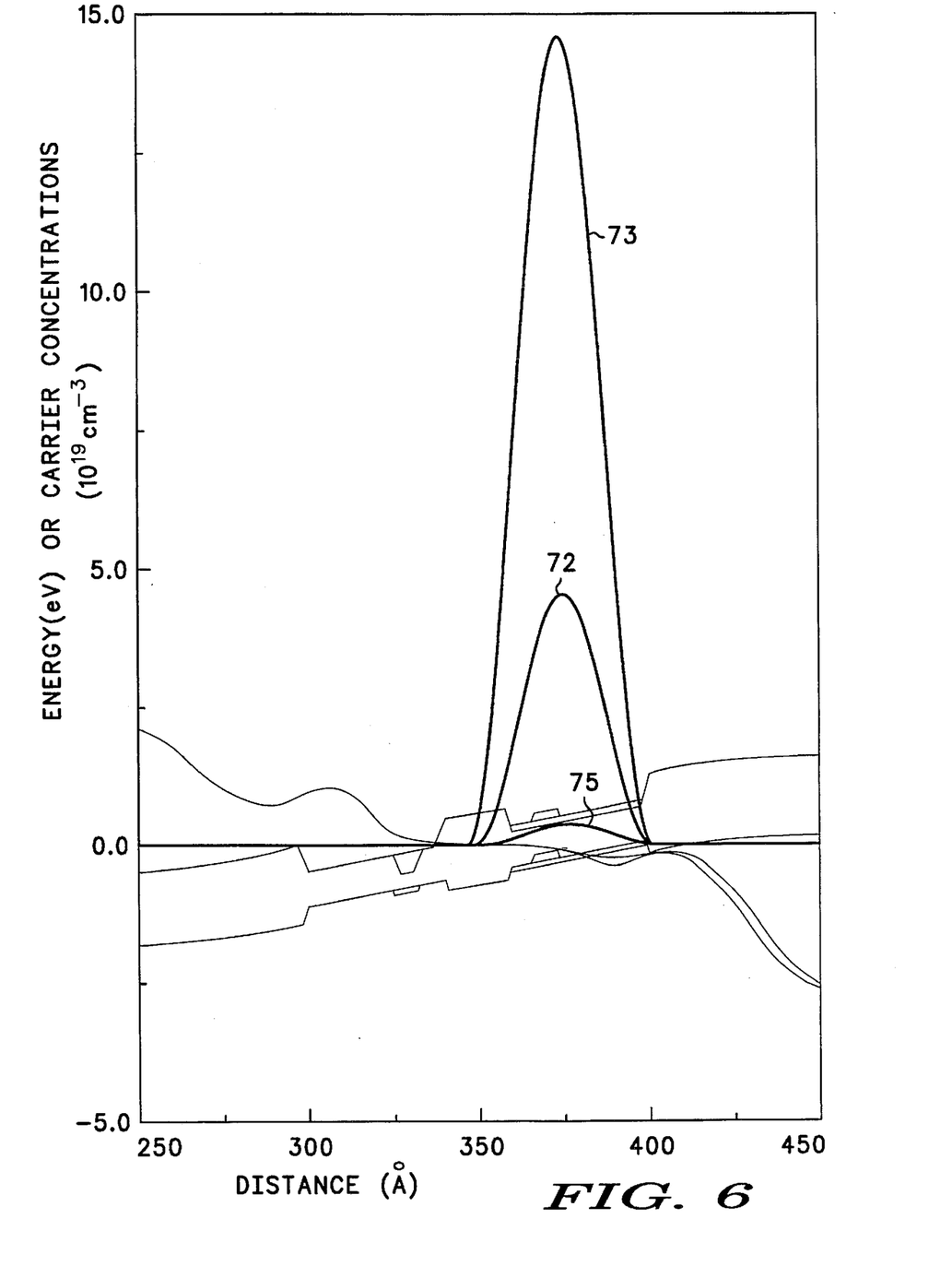
FIG. 6 is a greatly enlarged carrier concentration illustrating the effect of a combination of the effects/structures of FIGS. 3–5.

Turning now to FIG. 6, a greatly enlarged carrier concentration diagram illustrating the effect of a combination of the effects/structures of FIGS. 3 and 4 is illustrated. The total overlaps between electron and hole distribution for diode 20 were measured and are illustrated as peaks 72 and 73 in FIG. 6. Also, a peak 75 is illustrated for diode 10 of FIG. 1. Peak 75 represents a sum of 15, or the total overlap between electron and hole distribution. Peak 72 represents a sum of 107, which is the total overlap between electron and hole distribution in diode 20 when quantum well layer 23 is formed of GaSbAs. Peak 73 represents a sum of 283, which is the total overlap between electron and hole distribution in diode 20 when a GaSb monolayer 25 is included in quantum well layer 23 and an InAs monolayer 32 is included in quantum well layer 30. The effects of barrier layer 35 are not included because it is primarily included to reduce leakage current (valley current).

Thus, new and improved heterojunction tunnel diodes with improved P/V current ratios are provided. The new and improved heterojunction tunnel diodes with improved P/V current ratios are easily fabricated utilizing specific materials which substantially enhance the peak current and reduce the valley current. The new and improved heterojunction tunnel diodes have a substantially increased overlap between hole and electron distribution, which results in a large improvement in peak current density.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A heterojunction tunnel diode with improved peak-to-valley current ratio comprising:

a first barrier layer with a first type of doping and a second barrier layer with a second type of doping opposite the first type of doping;

a quantum well formation including first and second quantum well layers with a barrier layer sandwiched therebetween, the quantum well formation being sandwiched between the first and second barrier layers with the first quantum well layer being positioned adjacent the first barrier layer and the second quantum well layer being positioned adjacent the second barrier layer; and the first quantum well layer including gallium antimonide arsenide.

2. A heterojunction tunnel diode with improved peak-to-valley current ratio as claimed in claim 1 wherein the first quantum well layer is formed of gallium antimonide arsenide having a general equation $GaSb_xAs_{1-x}$.

3. A heterojunction tunnel diode with improved peak-to-valley current ratio as claimed in claim 2 wherein the first quantum well layer is formed of gallium antimonide arsenide having the general equation $GaSb_xAs_{1-x}$, where x is approximately equal to 0.48.

4. A heterojunction tunnel diode with improved peak-to-valley current ratio as claimed in claim 1 wherein the first barrier layer includes AlSbAs.

5. A heterojunction tunnel diode with improved peak-to-valley current ratio as claimed in claim 4 wherein the first barrier layer is formed of AlSbAs having a general equation $AlSb_xAs_{1-x}$.

6. A heterojunction tunnel diode with improved peak-to-valley current ratio as claimed in claim 5 wherein the first barrier layer is formed of AlSbAs having the general equation $AlSb_xAs_{1-x}$, where x is approximately equal to 0.57.

7. A heterojunction tunnel diode with improved peak-to-valley current ratio as claimed in claim 1 wherein the quantum well formation includes a first monolayer of material sandwiched in the first quantum well layer, the first monolayer of material having a valence band which is higher than a valence band of the first quantum well layer.

8. A heterojunction tunnel diode with improved peak-to-valley current ratio as claimed in claim 7 wherein the first monolayer of material includes a monolayer of gallium antimonide sandwiched in the first quantum well layer.

9. A heterojunction tunnel diode with improved peak-to-valley current ratio as claimed in claim 7 wherein the first quantum well layer produces a peak in carrier accumulations, which peak is generally situated within the first quantum well layer, and the first monolayer of material is sandwiched in the first quantum well layer generally at the peak in carrier accumulations.

10. A heterojunction tunnel diode with improved peak-to-valley current ratio as claimed in claim 1 wherein the quantum well formation includes a second monolayer of material sandwiched in the second quantum well layer, the second monolayer of material having a lower conduction band than a conduction band of the second quantum well layer.

11. A heterojunction tunnel diode with improved peak-to-valley current ratio as claimed in claim 10 wherein the second monolayer of material includes a monolayer of indium arsenide sandwiched in the second quantum well layer.

12. A heterojunction tunnel diode with improved peak-to-valley current ratio as claimed in claim 10 wherein the second quantum well layer produces a peak in carrier accumulations, which peak is generally situated within the second quantum well layer, and the second monolayer of material is sandwiched in the second quantum well layer generally at the peak in carrier accumulations.

13. A heterojunction tunnel diode with improved peak-to-valley current ratio comprising:

a first barrier layer with a first type of doping and a second barrier layer with a second type of doping opposite the first type of doping;

a quantum well formation including first and second quantum well layers with a barrier layer sandwiched therebetween, the quantum well formation being sandwiched between the first and second barrier layers with the first quantum well layer being positioned adjacent the first barrier layer and the second quantum well layer being positioned adjacent the second barrier layer; and the first barrier layer including aluminum antimonide arsenide.

14. A heterojunction tunnel diode with improved peak-to-valley current ratio as claimed in claim 13 wherein the p-doped barrier layer is formed of AlSbAs having a general equation $AlSb_xAs_{1-x}$.

15. A heterojunction tunnel diode with improved peak-to-valley current ratio as claimed in claim 14 wherein the p-doped barrier layer is formed of AlSbAs having the general equation $AlSb_xAs_{1-x}$, where x is approximately equal to 0.57.

16. A heterojunction tunnel diode with improved peak-to-valley current ratio as claimed in claim 13 wherein the quantum well formation includes a first monolayer of material sandwiched in the first quantum well layer, the first monolayer of material having a higher valence band than a valence band of the first quantum well layer.

17. A heterojunction tunnel diode with improved peak-to-valley current ratio as claimed in claim 16 wherein the first monolayer of material includes a monolayer of gallium antimonide sandwiched in the first quantum well layer.

18. A heterojunction tunnel diode with improved peak-to-valley current ratio as claimed in claim 16 wherein the first quantum well layer produces a peak in hole accumulations, which peak is generally situated within the first quantum well layer, and the first monolayer of material is sandwiched in the first quantum well layer generally at the peak in hole accumulations.

19. A heterojunction tunnel diode with improved peak-to-valley current ratio as claimed in claim 13 wherein the quantum well formation includes a second monolayer of material sandwiched in the second quantum well layer, the second monolayer of material having a lower conduction band than a conduction band of the second quantum well layer.

20. A heterojunction tunnel diode with improved peak-to-valley current ratio as claimed in claim 19 wherein the second monolayer of material includes a monolayer of indium arsenide sandwiched in the second quantum well layer.

21. A heterojunction tunnel diode with improved peak-to-valley current ratio as claimed in claim 19 wherein the second quantum well layer produces a peak in electron accumulations, which peak is generally situated within the second quantum well layer, and the second monolayer of material is sandwiched in the second quantum well layer generally at the peak in electron accumulations.

22. A heterojunction tunnel diode with improved peak-to-valley current ratio comprising:

a first barrier layer with a first type of doping and a second barrier layer with a second type of doping opposite the first type of doping;

a quantum well formation including first and second quantum well layers formed of first and second materials, respectively, with a barrier layer sandwiched therebetween, the quantum well formation being sandwiched between the first and second barrier layers with the first quantum well layer being positioned adjacent the first barrier layer and the second quantum well layer being positioned adjacent the second barrier layer; and the first quantum well layer including a first monolayer of material, having a valence band higher than the valence band of the first material, sandwiched therein and the second quantum well layer including a second monolayer of material, having a conduction band lower than the conduction band of the second material, sandwiched therein.

23. A heterojunction tunnel diode with improved peak-to-valley current ratio as claimed in claim 22 wherein the first quantum well layer is formed of gallium antimonide arsenide.

24. A heterojunction tunnel diode with improved peak-to-valley current ratio as claimed in claim 23 wherein the first quantum well layer is formed of gallium antimonide arsenide having a general equation $GaSb_xAs_{1-x}$.

25. A heterojunction tunnel diode with improved peak-to-valley current ratio as claimed in claim 24 wherein the first quantum well layer is formed of material having the general equation $GaSb_xAs_{1-x}$, where x is approximately equal to 0.48.

26. A heterojunction tunnel diode with improved peak-to-valley current ratio as claimed in claim 22 wherein the first barrier layer includes AlSbAs.

27. A heterojunction tunnel diode with improved peak-to-valley current ratio as claimed in claim 26 wherein the first barrier layer is formed of AlSbAs having a general equation $AlSb_xAs_{1-x}$.

28. A heterojunction tunnel diode with improved peak-to-valley current ratio as claimed in claim 27 wherein the first barrier layer is formed of AlSbAs having the general equation $AlSb_xAs_{1-x}$, where x is approximately equal to 0.57.

29. A heterojunction tunnel diode with improved peak-to-valley current ratio as claimed in claim 22 wherein the second monolayer includes a monolayer of indium arsenide sandwiched in the second quantum well layer.

30. A heterojunction tunnel diode with improved peak-to-valley current ratio as claimed in claim 22 wherein the second quantum well layer produces a peak in carrier accumulations, which peak is generally situated within the second quantum well layer, and the second monolayer of material is sandwiched in the second quantum well layer generally at the peak in carrier accumulations.

31. A heterojunction tunnel diode with improved peak-to-valley current ratio as claimed in claim 22 wherein the first monolayer of material includes a monolayer of gallium antimonide sandwiched in the first quantum well layer.

32. A heterojunction tunnel diode with improved peak-to-valley current ratio as claimed in claim 22 wherein the first quantum well layer produces a peak in carrier accumulations, which peak is generally situated within the first quantum well layer, and the first monolayer of material is sandwiched in the first quantum well layer generally at the peak in carrier accumulations.

33. A heterojunction tunnel diode with improved peak-to-valley current ratio comprising:

a first barrier layer with a p-type of doping and a second barrier layer with a n-type of doping, the first barrier layer including aluminum antimonide arsenide having a general equation $AlSb_xAs_{1-x}$;

a quantum well formation including first and second quantum well layers with a barrier layer sandwiched therebetween, the first quantum well layer including gallium antimonide arsenide having a general equation $GaSb_xAs_{1-x}$, the first quantum well layer producing a peak in hole accumulations, which peak is generally situated within the first quantum well layer, the second quantum well layer producing a peak in electron accumulations, which peak is generally situated within the second quantum well layer, the quantum well formation further including a monolayer of gallium antimonide sandwiched in the first quantum well layer generally at the peak in hole accumulations and a monolayer of indium arsenide sandwiched in the second quantum well layer generally at the peak in electron accumulations, the quantum well formation being sandwiched between the first and second barrier layers with the first quantum well layer being positioned adjacent the first barrier layer and the second quantum well layer being positioned adjacent the second barrier layer.

* * * * *